US006614252B2

United States Patent
Takeuchi (10) Patent No.: US 6,614,252 B2
(45) Date of Patent: Sep. 2, 2003

(54) SEMICONDUCTOR TEST APPARATUS WITH REDUCED POWER CONSUMPTION AND HEAT GENERATION

(75) Inventor: Nobuaki Takeuchi, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 38 days.

(21) Appl. No.: 09/911,342

(22) Filed: Jul. 23, 2001

(65) Prior Publication Data

US 2002/0043987 A1 Apr. 18, 2002

(30) Foreign Application Priority Data

Jul. 26, 2000 (JP) ..................... P2000-225862

(51) Int. Cl.[7] .............................................. G01R 31/26
(52) U.S. Cl. ..................... 324/765; 324/158.1
(58) Field of Search ............... 324/73.1, 759, 324/763, 765, 768–769, 158.1; 327/63, 72, 170, 551; 257/40, 48; 714/724, 733–736

(56) References Cited

U.S. PATENT DOCUMENTS 5,070,297 A * 12/1991 Kwon et al. ............... 324/754
5,721,490 A * 2/1998 Takano et al. ............. 324/322
5,721,495 A * 2/1998 Jennion et al. ............ 324/765

* cited by examiner

Primary Examiner—Kamand Cuneo
Assistant Examiner—Minh N. Tang
(74) Attorney, Agent, or Firm—Darby & Darby (57) ABSTRACT

The present invention allows reducing the power consumption, reducing the amount of heat generation, improving the frequency characteristics, and reducing noise superposition. A control circuit 25 supplies to a control circuit 5 a control signal CS 1 that indicates the setting voltage of a DUT 9 as a control signal CS 8. In addition, the control circuit 25 controls switching power sources 21 and 22 and the polarity control circuits 23 and 24 depending on control signals CS 4 to CS 7 such that the voltage drop amount of the control elements 6 and 7 becomes a value sufficient to operate the control elements 6 and 7 based on a control signal CS 1 and a detected signal DS2 that is fed back from the DUT 9. The control circuit 5 controls the control elements 6 and 7 depending on the control signal CS 8. The control elements 6 and 7 generate a voltage that is to be output to the DUT 9 from the output voltage generated by the switching power sources 21 and 22 and whose polarity is controlled by the polarity control circuits 23 and 24.

7 Claims, 8 Drawing Sheets

Vco VOLTAGE OF THE REGULATOR TR = 2V
DC/DC CONVERTER MINIMUM OUTPUT = 1V

Fig. 4

Vco VOLTAGE OF THE REGULATOR TR = 2V
DC/DC CONVERTER MINIMUM OUTPUT = 2V

Fig. 5

Vco VOLTAGE OF THE REGULATOR TR = 2V
DC/DC CONVERTER MINIMUM OUTPUT = 3V

Vco VOLTAGE OF THE REGULATOR TR = 2V
DC/DC CONVERTER MINIMUM OUTPUT = 3V
DC/DC CONVERTER EFFICIENCY = 90%

Fig. 8

Vco VOLTAGE OF THE REGULATOR TR = 2V
DC/DC CONVERTER MINIMUM OUTPUT = 1V
DC/DC CONVERTER EFFICIENCY = 90%
DUT RESISTANCE = 1 OHM

Fig. 9 PRIOR ART

PRIOR ART

Fig. 10

SEMICONDUCTOR TEST APPARATUS WITH REDUCED POWER CONSUMPTION AND HEAT GENERATION

BACKGROUND OF THE INVENTION

1. Field of the Invention

The present invention relates to a semiconductor test apparatus used in IC testing technology, and provides a power source to a measured device.

2. Description of the Related Art

Figure 9:
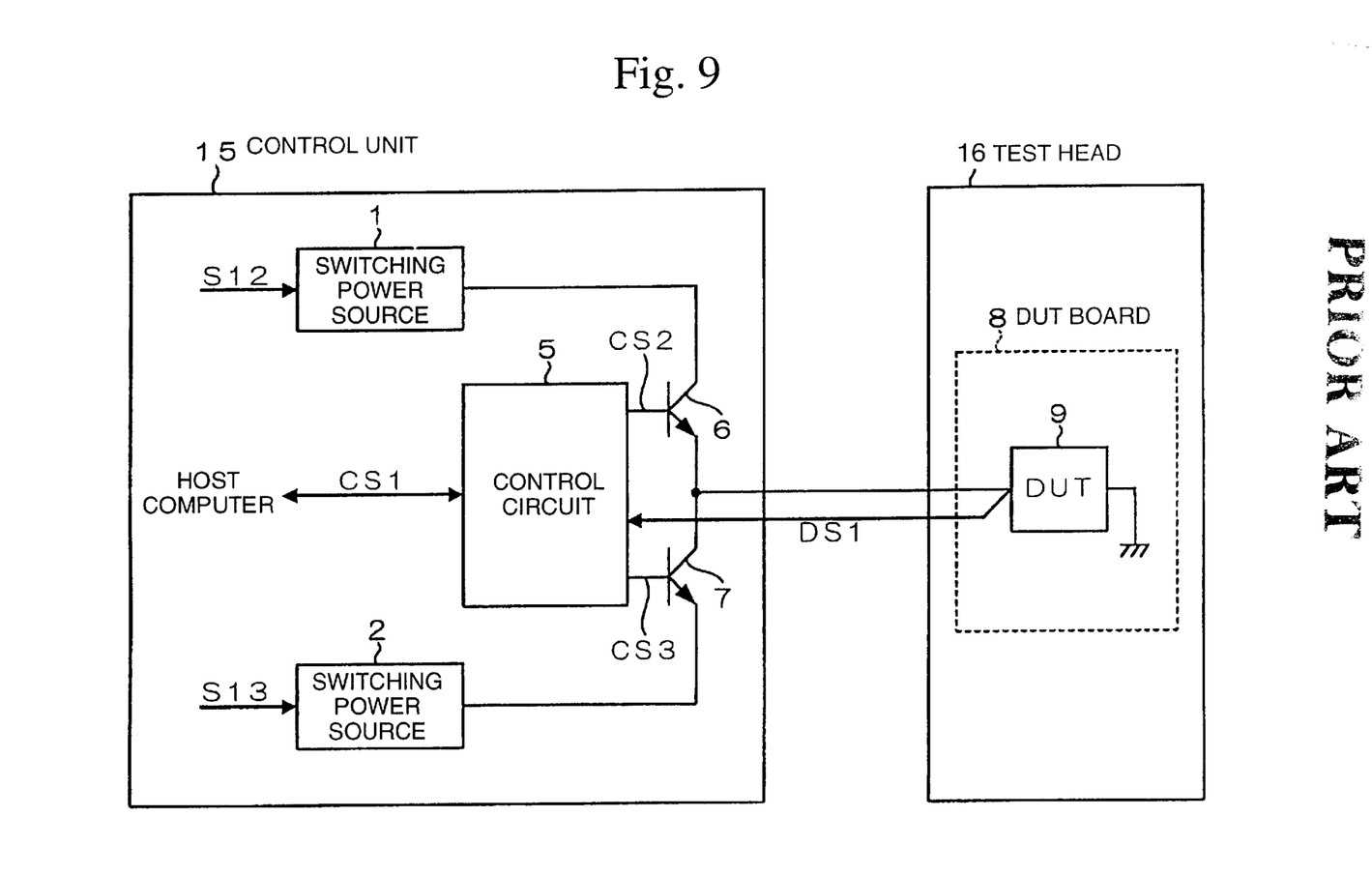
FIG. 9 is a block diagram showing the structure of a semiconductor test apparatus according to conventional technology.

FIG. 9 is a block diagrams showing the structure of the conventional technology for a semiconductor test apparatus. The DUT 9, which is the measured device, is mounted on the DUT (device under test) board 8 that is on the test head 16. By applying an arbitrary voltage to the DUT 9, a test of the DUT 9 is carried out. At a location separated from the test head 16, a control unit 15 is provided. On the control unit 15, switching power sources 1 and 2, control elements 6 and 7, and a control circuit 5 are provided in order to generate the arbitrary voltage. The switching power sources 1 and 2 generate a positive or negative constant voltage from each of the AC power sources S 12 and S 13 such that the sign of the applied voltage that is applied to the DUT 9 can be arbitrarily set, and forms circuits complementary to control elements 6 and 7.

Figure 10:
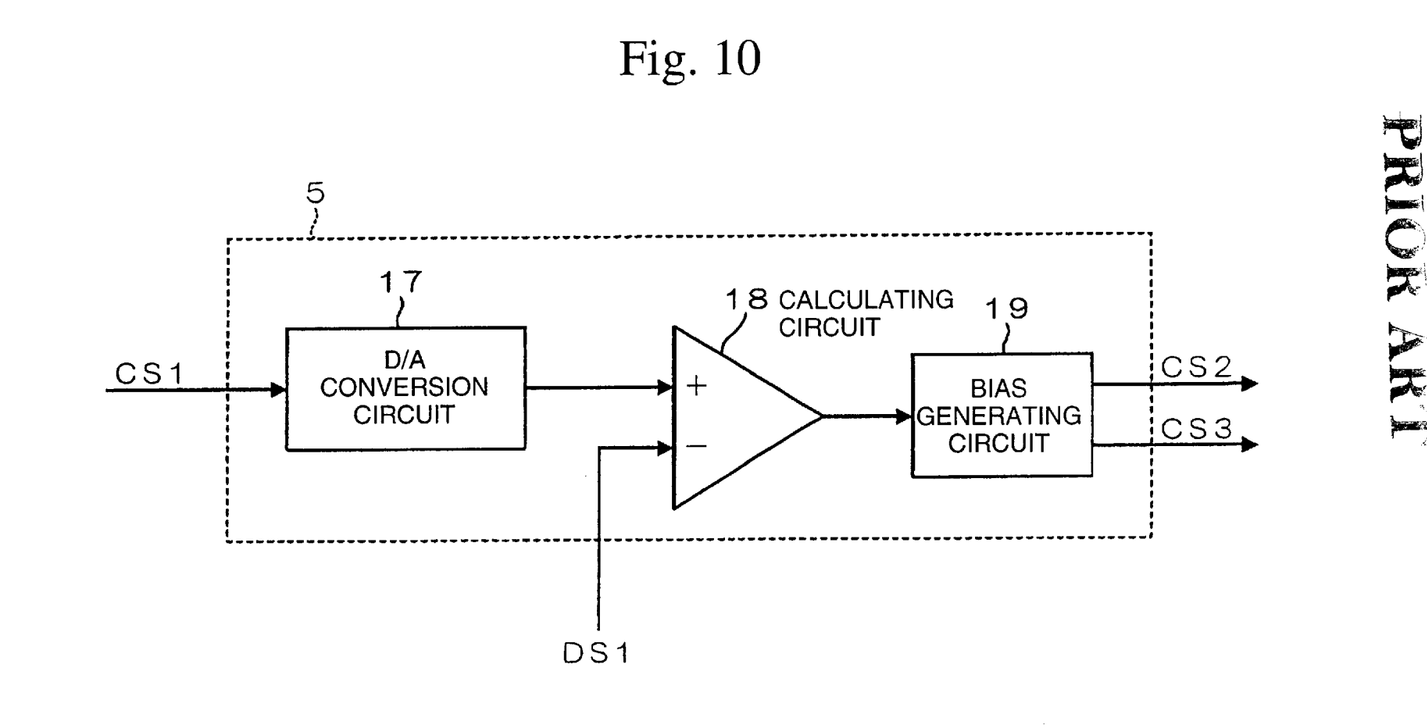
FIG. 10 is a block diagram showing the structure of the control circuit 5 of the semiconductor test apparatus in the conventional technology.

Next, FIG. 10 shows the structure of the control circuit 5 of the semiconductor test device according to the conventional technology. A target setting voltage from a host computer (not illustrated) to the DUT 9 is supplied to a D/A conversion circuit 17 as a digital control signal CS 1. The D/A conversion circuit 17 converts the control signal CS 1 to an analog value, and outputs this to the calculating circuit 18.

In the calculating circuit 18, the difference between the analog control signal CS 1 output from the D/A conversion circuit 17 and the detected signal DS 1, which is the DUT terminal voltage of the DUT 9, is found and supplied to the bias generating circuit 19. At the bias generating circuit 19, a bias value for operating the control elements 6 and 7 is added to the differential signal output from the calculating circuit 18 and supplied to the control elements 6 and 7 respectively as control signals CS 2 and CS 3.

The voltage sources obtained by the control elements 6 and 7 are applied to the DUT 9 via the DUT board on the test head 16. The reason that the detected signal DS 1 is introduced from the DUT 9 rather than at the output terminals of the control elements 6 and 7 is to prevent a voltage setting error due to a voltage drop between the control elements 6 and 7 and the DUT 9.

However, in this conventional technology, there are the problems of a large loss due to the voltage drop of the control elements 6 and 7, heat generation, and efficiency. This is because in order to set the DUT 9 to an arbitrary voltage, a voltage supplying only the maximum voltage that can be set in the DUT 9 must be supplied to the control elements 6 and 7 from the switching power sources 1 and 2. Due to this, when the setting voltage of the DUT 9 is low, the voltage drop of the control elements 6 and 7 becomes large, and there are the problems concerning heat generation and efficiency.

In addition, due to the heat generation, not only is a heat radiating device necessary, but also high-density packaging becomes difficult, and thus miniaturization of the apparatus becomes difficult. Therefore, disposing the control elements 6 and 7 on the test head becomes a problem. Thus, due to making the distance between the control elements 6 and 7 large, there are the problems that deterioration of the frequency characteristics and noise superposition occur, and furthermore, energy loss and the like due to the voltage drop of the wiring part occurs.

SUMMARY OF THE INVENTION

In consideration of the problems described above, it an object of the present invention to provide a semiconductor test apparatus that allows reducing the consumed power, reduction of the amount of heat generated, an improvement of the frequency characteristics, and a reduction of noise superposition.

In a first aspect of the invention, a semiconductor test apparatus that applies a variable voltage to a measured device to test the measured device provides constant voltage generating devices that generate a plurality of variable voltages; voltage polarity control devices that control the polarity of the plurality of variable voltages generated by the constant voltage generating device; control elements that generate an applied variable voltage applied to the measured device from the plurality of variable voltages whose polarity is controlled by the voltage polarity control devices; a first control device that controls the generation operation of the applied variable voltage in the control elements based on the fixed applied voltage that is applied to the measured device and the terminal voltage of the measured device fed back from the measured device; and a second control device that controls the variable voltage value controlled by the constant voltage generating device and the polarity control controlled by the voltage polarity control device based on the fixed applied voltage that is applied to the measured device and the terminal voltage of the measured device fed back from the measured device. device based on the fixed applied voltage that is applied to the measured device and the terminal voltage of the measured device fed back from the measured device.

In a second aspect of the present invention, a semiconductor test apparatus according to the first aspect is characterized in that the second control device links the voltage drop amount of the control element to the fixed applied voltage that is applied to the measured device so that the value thereof becomes sufficient for the operation of the control elements, and controls the variable voltage value controlled by the constant voltage generating device and the polarity control controlled by the voltage polarity control device.

In a third aspect of the present invention, a semiconductor test apparatus according to the first aspect is characterized in that the control elements and the first control device are provided on the test head on which the measured device is mounted; a constant voltage generating device, the voltage polarity control device, and a second control device are provided on the control unit disposed separated from the test head; and a digital signal is used in signal propagation between the test head and the control unit.

In a fourth aspect of the present invention, a semiconductor test apparatus according to the first aspect is characterized in that the constant voltage generating device provides: a first switching constant voltage generating device that generates an output voltage that is larger than the fixed applied voltage that is applied to the measured device; and a second switching constant voltage generating device that generates an output voltage that is smaller than the fixed applied voltage that is applied to the measured device.

In a fifth aspect of the present invention, a semiconductor test apparatus according to the first aspect is characterized in that the voltage polarity control device can reverse or not reverse the polarity of the plurality of variable voltages generated by the constant voltage generating device or short the plurality of variable voltages based on the control of the second control device.

In a sixth aspect of the present invention, a semiconductor test apparatus according to the second aspect is characterized in that the second control device: A: in the case that the fixed applied voltage that is applied to the measured device is positive, the voltage output of the first switching constant voltage generating device is output as is in the case that the output voltage of the first switching constant voltage generating device can be set to a voltage equivalent to the fixed applied voltage having added thereto the amount of voltage drop necessary for allowing the control element to operate stably; the minimum output voltage of the first switching constant voltage generating device is output in the case that a voltage equivalent to the fixed applied voltage having added thereto the amount of voltage drop necessary for allowing the control element to operate stably is lower than the minimum output voltage of the first switching constant voltage generating device; the output voltage of the second switching voltage generating device is output as is in the case that the output voltage of the second switching constant voltage generating device can be set to a voltage equivalent to the fixed applied voltage having subtracted therefrom the amount of voltage drop necessary for allowing the control element to operate stably; the output of the second switching constant voltage generating device is shorted by the voltage polarity control device in the case that a voltage equivalent to the fixed applied voltage having subtracted therefrom the amount of voltage drop necessary for allowing the control element to operate stably is positive, and this voltage is smaller than the minimum output voltage of the second switching constant voltage generating device; the minimum output voltage of the second switching constant voltage generating device is output and the output of the voltage polarity control device located at the output side of the second switching constant voltage generating device is reversed in the case that a voltage equivalent to the fixed applied voltage having subtracted therefrom the amount of voltage drop necessary for allowing the control element to operate stably is negative, and this voltage is smaller than the minimum output voltage of the second switching constant voltage generating device; the variable voltage value controlled by the constant voltage generating device and the polarity control controlled by the voltage polarity control device are controlled such that the absolute value of the output voltage from the second switching constant voltage generating device is output and the output of the voltage polarity control device that is located at the output side of the second switching constant voltage generating device is reversed in the case that a voltage equivalent to the fixed applied voltage having subtracted therefrom the amount of voltage drop necessary for allowing the control element to operate stably is negative and larger than the minimum output voltage of the second switching voltage generating device; and B: in the case that the target voltage applied to the measured device is negative: the output voltage of the second switching constant voltage generating device is output and the output of the voltage polarity control device, which is located at the output side of the second switching constant voltage generating device, is reversed in the case that the output voltage of the second switching constant voltage generating device can be set to the absolute value of a voltage equivalent to the fixed applied voltage having subtracted therefrom the amount of voltage drop necessary for allowing the control element to operate stably; the minimum output voltage of the second switching constant voltage generating device is output and the output of the voltage polarity control device, which is located at the output side of the second switching constant voltage generating device is reversed in the case that the absolute value of the a voltage equivalent to the fixed applied voltage having subtracted therefrom the amount of voltage drop necessary for allowing the control element to operate stably is lower than the minimum output voltage of the second switching constant voltage generating device; the output voltage of the first switching constant voltage generating device is output and the output of the voltage polarity control device, which is located at the output side of the second switching constant voltage generating device, is reversed in the case that the output voltage of the first switching constant voltage generating device can be set to the absolute value of a voltage equivalent to the fixed applied voltage having added thereto the amount of voltage drop necessary for allowing the control element to operate stably; the output of the voltage polarity control device, which is located at the output side of the first switching constant voltage generating device, is shorted in the case that a voltage equivalent to the fixed applied voltage having added thereto the amount of voltage drop necessary for allowing the control element to operate stably is negative and smaller than the value produced by multiplying the minimum output voltage of the first switching constant voltage generating device by −1; the minimum output voltage of the first switching constant voltage generating device is output in the case that a voltage equivalent to the fixed applied voltage having added thereto the amount of voltage drop necessary for allowing the control element to operate stably is positive and smaller than the minimum output voltage of the first switching constant voltage generating device; and the variable voltage value controlled by the constant voltage generating device and the polarity control controlled by the voltage polarity control device are controlled such that the output voltage of the first switching constant voltage generating device is output as is in the case that a voltage equivalent to the fixed applied voltage having added thereto the amount of voltage drop necessary for allowing the control element to operate stably is positive and larger than the minimum output voltage of the first switching constant voltage generating device.

In a seventh aspect of the present invention, a semiconductor test apparatus according to the first aspect is characterized in that the control elements and the first control device form one group, the groups are provided in plurality in parallel, and the plurality of applied variable voltages generated by each of the groups is applied to the measured device.

DETAILED DESCRIPTION OF THE INVENTION

Below, the preferred embodiments will be explained referring to the drawings.

A: First Embodiment

A-1: Structure of the First Embodiment

Figure 1:
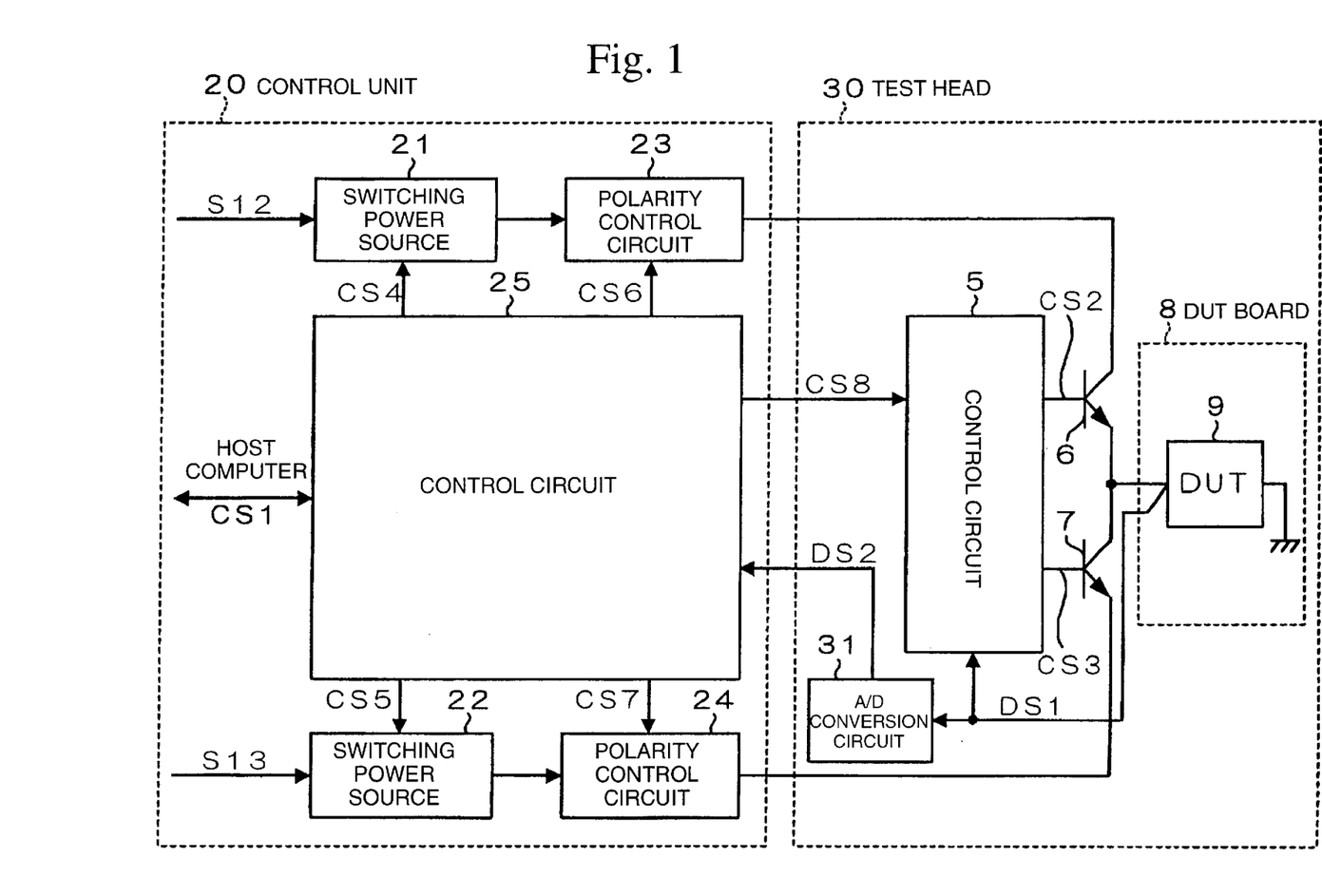
FIG. 1 is a block diagram showing the structure of the semiconductor test device according to the first embodiment of the present invention.

FIG. 1 is a block drawing showing the structure of the semiconductor test apparatus according to a first embodiment of the present invention. Parts that correspond to those in FIG. 9 are denoted by the same reference numerals, and their explanations have been omitted. In the figure, the control unit 20 provides switching power sources 21 and 22, polarity control circuits 23 and 24, and a control circuit 25. Each of the switching power sources 21 and 22 transforms the AC power sources S 12 and S 13 to DC voltage sources, which are provided to the polarity control circuits 23 and 24. The output voltages of the switching power sources 21 and 22 are respectively set by the control signals CS 4 and CS 5 from the control circuit 25. The voltages that are output from the switching power sources 21 and 22 need not be strictly setting voltage values, but can be approximate values. Depending on the control signals CS 6 and CS 7 from the control circuit 25, each of the polarity control circuits 23 and 24 controls whether the polarity of the DC voltage source from the switching power sources 21 and 22 is reversed or not, or whether the output thereof is connected to the ground.

The control circuit 25 receives the setting voltage information of the DUT 9 from the host computer (not illustrated) as the digital control signal CS 1, and this signal is supplied to the control circuits of the test head 30 as a control signal CS 8, which is the control target value. The digital value of this control signal CS 8 is strictly speaking the setting voltage value of the OUT 9. In addition, the control circuit 25 outputs the above-described control signals CS 4 to CS 7 and controls the switching power sources 21 and 22 and the polarizing control circuits 23 and 24 based on the detected signal DS 2 fed back from the test head 30 described below, that is, the terminal voltage of the OUT 9 that is the tested object.

The test head 30 provides a control circuit 5, control elements 6 and 7, a OUT board 8, and an NO conversion circuit 31. the control unit 5 calculates the difference between the control signal CS 8, which is the control target value supplied from the control circuit 25, and the detected signal DS 1 which is the DUT terminal voltage of the OUT 9, adds a bias for operating the control elements 6 and 7 to this differential signal, and supplies the result to the control elements 6 and 7 as control signals CS 2 and CS 3. between the control signal CS 8, which is the control target value supplied from the control circuit 25, and the detected signal DS 1 which is the DUT terminal voltage of the DUT 9, adds a bias for operating the control elements 6 and 7 to this differential signal, and supplies the result to the control elements 6 and 7 as control signals CS 2 and CS 3.

Depending on the control signals CS2 and CS3 described above, the control elements 6 and 7 generate the voltage to be supplied to the DUT 9 from the output voltage supplied from the polarity identification circuits 23 and 24 and supplied to the DUT board 8. A voltage that is generated from the control elements 6 and 7 is applied to the DUT 9 on the DUT board 8. Then the DUT terminal voltage of the DUT 9 is fed back to the control circuit 5 and the A/ID conversion circuit 31 as a detected signal DS 1. The A/D conversion circuit 31 converts the detected signal DS 1 (the DUT terminal voltage) to a digital signal, and supplies this to the host computer via the control circuit 25 as the detected signal DS 2.

Figure 2:
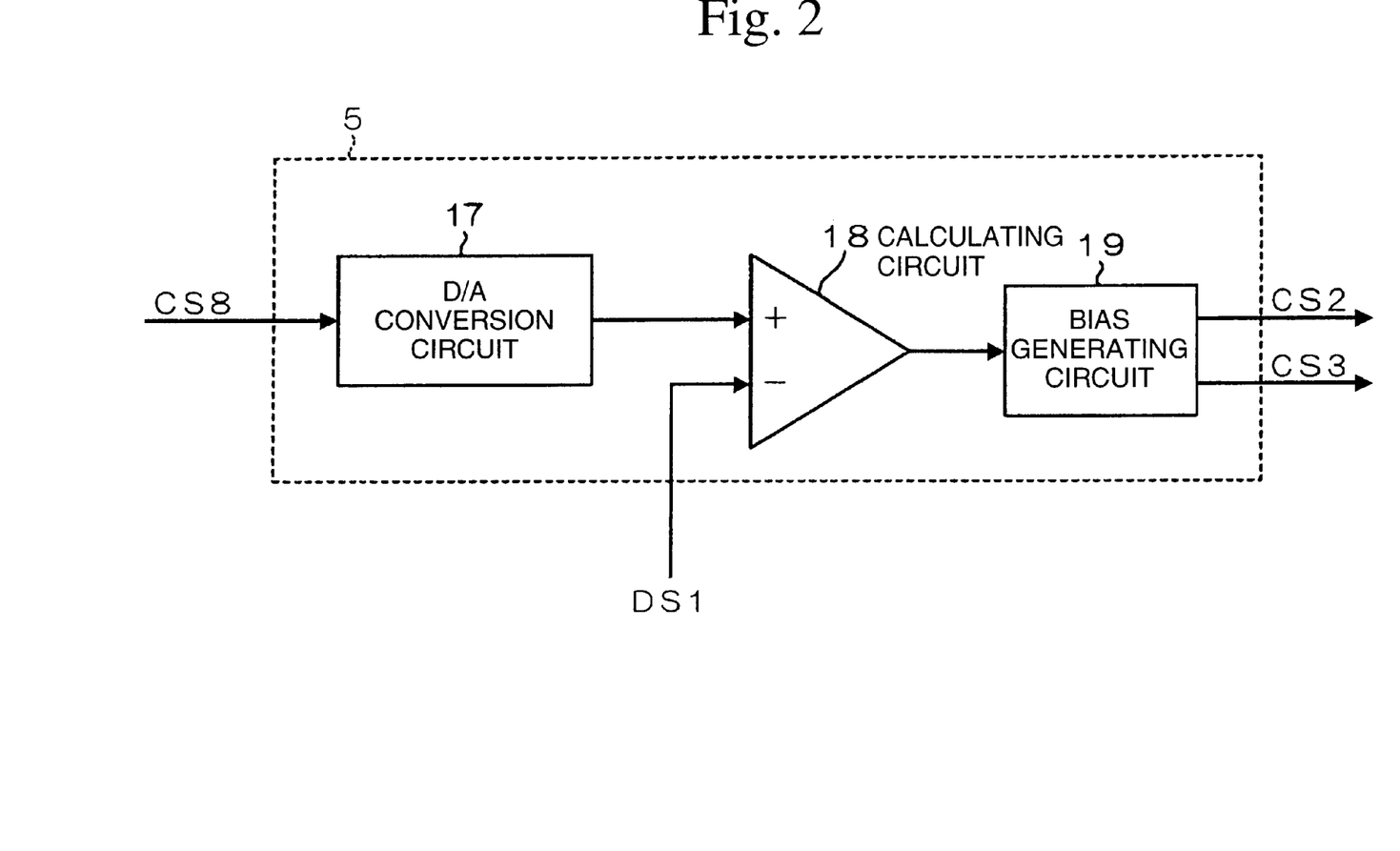
FIG. 2 is a block diagram showing the structure of the control circuit 5 of the semiconductor test apparatus according to the first embodiment.

Next, FIG. 2 is a block diagram showing the structure of the control circuit 5 of the semiconductor test apparatus according to the first embodiment. In this figure, except for the point that the input signal is changed to control signal CS 8, the structure of the control circuit 5 is identical to that of the control circuit 5 of the conventional technology. The D/A conversion circuit 17 converts the control signal CS 8 supplied from the control circuit 25 to an analog signal, which is then supplied to the calculating circuit 18 as a reference voltage, that is, a control target value. The calculating circuit 18 calculates the difference between the control target value supplied to one input terminal and the detected signal DS 1 (the voltage of the DUT terminal) supplied to the other input terminal, and supplies this to the bias generating circuit 19. The bias circuit 19 adds the bias for operating the control elements 6 and 7 to the differential signal, and supplies the result to the control elements 6 and 7 as control signals CS 2 and CS 3.

A-2: Operation of the First Embodiment

Next, the operation of the first embodiment will be explained in detail.

In the control circuit 25, the control signal CS 1, which is supplied from the host computer and indicates the setting voltage of the DUT 9, is supplied to the control circuit 5 of the test head 30 as the control signal CS 8, and at the same time, the control signals CS 4 to CS 7 are output based on the control signal CS 1 and the detected signal DS 2 fed back from the test head 30, that is, the terminal voltage of the DUT 9 that is the tested object, and thereby the switching power sources 21 and 22 and the polarity control circuits 23 and 24 are controlled. At the switching power sources 21 and 22, each of the AC power sources S 12 and S 13 are converted to a DC voltage having a value that is set by the control signals CS 4 and CS 5. The DC voltage from the switching power sources 21 and 22 is supplied to each of the polarity control circuits 23 and 24, and in the polarity control circuits 23 and 24, depending on the control signals CS 6 and CS 7, the polarity of the voltage is either not reversed or reversed -and then supplied to the control elements 6 and 7, or the voltage is shorted by being connected to the ground.

Below, the method of controlling the switching power sources 21 and 22 and the polarity control circuits 23 and 24 by the control circuit 25 is explained in detail.

The Case in Which the DUT Setting Voltage (Control Signal CS 1) is Positive (1) In the case that the output voltage of the switching power source 21 can be set to a "voltage equivalent to the DUT setting voltage having added thereto the amount of voltage drop necessary for allowing the control element 6 to operate stably," this voltage value is output.

(2) In the case that the "voltage equivalent to the DUT setting voltage having added thereto the amount of voltage drop necessary for allowing the control elements 6 and 7 to operate stably" is lower than the minimum output voltage of the switching power source 21, the minimum output voltage of the switching power source 21 is output.

(3) In the case that the output voltage of the switching power source 22 can be set to the "a voltage equivalent to the DUT setting voltage having subtracted therefrom the amount of voltage drop necessary for allowing the control element 7 to operate stably", this voltage value is output.

(4) In the case that the "a voltage equivalent to the DUT setting voltage having subtracted therefrom the amount of voltage drop necessary for allowing the control element 7 to operate stably," is positive, and "this voltage is smaller than the minimum output voltage of the switching power source 22", the output of the polarity control circuit 24 that is located at the output of the switching power source 22 is shorted.

(5) In the case that the "a voltage equivalent to the DUT setting voltage having subtracted therefrom the amount of voltage drop necessary for allowing the control element 7 to operate stably," is negative, and "this voltage is smaller than the minimum output voltage of the switching power source 22", the minimum output voltage of the switching power source 22 is output, and the output of the polarizing control circuit 24 that is located at the output of the switching power source 22 is reversed.

(6) In the case that "the voltage equivalent to the DUT setting voltage having subtracted therefrom the amount of voltage drop necessary for allowing the control element 7 to operate stable" is negative, and this voltage is larger than the minimum output voltage of the switching power source 22", the absolute value of the output voltage from the switching power source 22 is output, and the output of the polarity control circuit 24 located at the output of the switching power source 22 is reversed.

The Case in Which the DUT Setting Voltage (Control Signal SC 1) is Negative (1) In the case that the output voltage of the switching power source 22 can be set to the "absolute value of a voltage equivalent to the DUT setting voltage having subtracted therefrom the amount of voltage drop necessary for allowing the control element 7 to operate stably", this voltage value is output, and the output of the polarizing control circuit 24 that is located at the output of the switching power source 22 is reversed.

(2) In the case that the "absolute value of a voltage equivalent to the DUT setting voltage having subtracted therefrom the amount of voltage drop necessary for allowing the control element 7 to operate stably," is lower than the minimum output voltage of the switching power source 22, the minimum output voltage of the switching power source 22 is output, and the output of the polarity control circuit 24 that is located at the output of the switching power source 22 is reversed.

(3) In the case that the output voltage of the switching power source 21 can be set to the "absolute value of the voltage equivalent to the DUT setting voltage having added thereto the amount of voltage drop necessary for allowing the control element 7 to operate stably", this voltage value is output, and the output of the polarity control circuit 24 that is located at the output of the switching power source 22 is reversed.

(4) In the case that the "a voltage equivalent to the DUT setting voltage having added thereto the amount of voltage drop necessary for allowing the control element 6 to operate stably," is negative, and "this voltage is smaller than the minimum output voltage of the switching power source 21 multiplied by −1", the output of the polarity control circuit 23 that is located at the output of the switching power source 21 is shorted.

(5) In the case that the "a voltage equivalent to the DUT setting voltage having added thereto the amount of voltage drop necessary for allowing the control element 6 to operate stably," is positive, and "this voltage is smaller than the minimum output voltage of the switching power source 21", the minimum output voltage of the switching power source 21 is output.

(6) In the case that the "a voltage equivalent to the DUT setting voltage having added thereto the amount of voltage drop necessary for allowing the control element 6 to operate stably," is positive, and "this voltage is larger than the minimum output voltage of the switching power source 21", the output voltage of the switching power source 22 is output as-is. This value is output to the switching power source 21.

Next, at the control circuit 5, after the control signal CS 8 is converted to an analog control target value by the D/A conversion circuit 17, the difference between the control target value and the detected signal DS 1, which is the actual terminal voltage of the DUT 9, is calculated by the calculating circuit 18, and this difference is supplied to the bias generating circuit 19. At the bias circuit 19, the bias for operating the control elements 6 and 7 is added to the differential signal, and the result is supplied to the control elements 6 and 7 as control signals CS 2 and CS 3.

At the control elements 6 and 7, depending on the control signals CS 2 and CS 3 from the control circuit 5, the voltage that will be output to the DUT 9 from the output voltage of the polarity identification circuits 23 and 24 is generated, and supplied to the DUT board 8. The voltage controlled by the control elements 6 and 7 is applied to the DUT 9 on the DUT board. In addition, the voltage of the DUT terminal of DUT 9 is fed back to the control circuit 5 and the A/D conversion circuit 31 as detected signal DS 1. At the A/D conversion circuit 31, the detected signal DS 1 (the voltage of the DUT terminal) is converted to a digital value, and supplied to the host computer via the control circuit 25.

Figure 3:
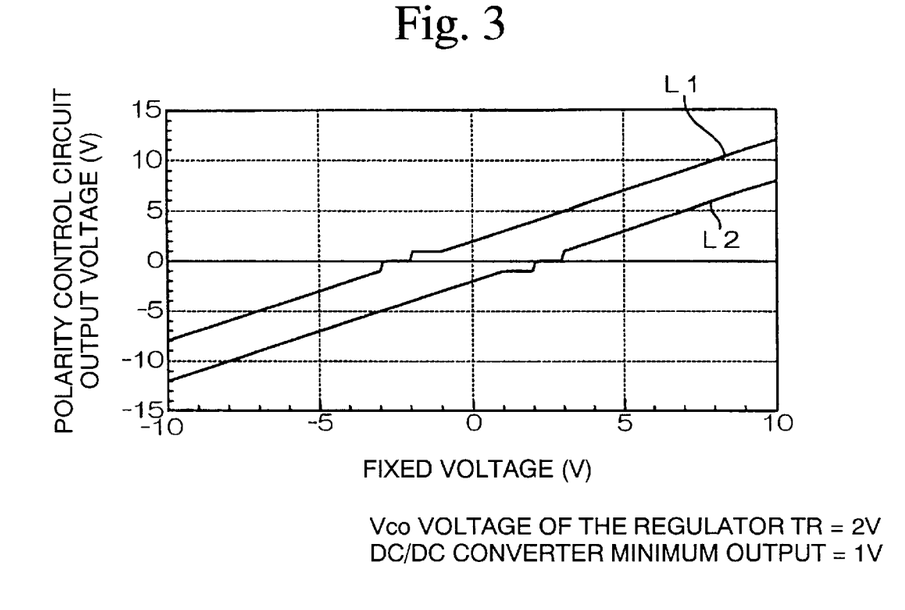
FIG. 3 is a conceptual diagram showing the output voltage of the polarity control circuits 23 and 24 due to the control circuit 25 for the constant voltage represented by the control signal CS 1.

FIG. 3 is a conceptual diagram showing the output voltage of the polarity control circuits 23 and 24 controlled by the control circuit 25 described above for the setting voltage indicated by the control signal CS 1. In the figure, line L1 is the output voltage on the positive polarity side, and line L2 is the output voltage on the negative polarity side. Moreover, the example shown in FIG. 3 is the case in which the minimum output voltage of the switching power source 21 and 22 is 1V.

Figure 4:
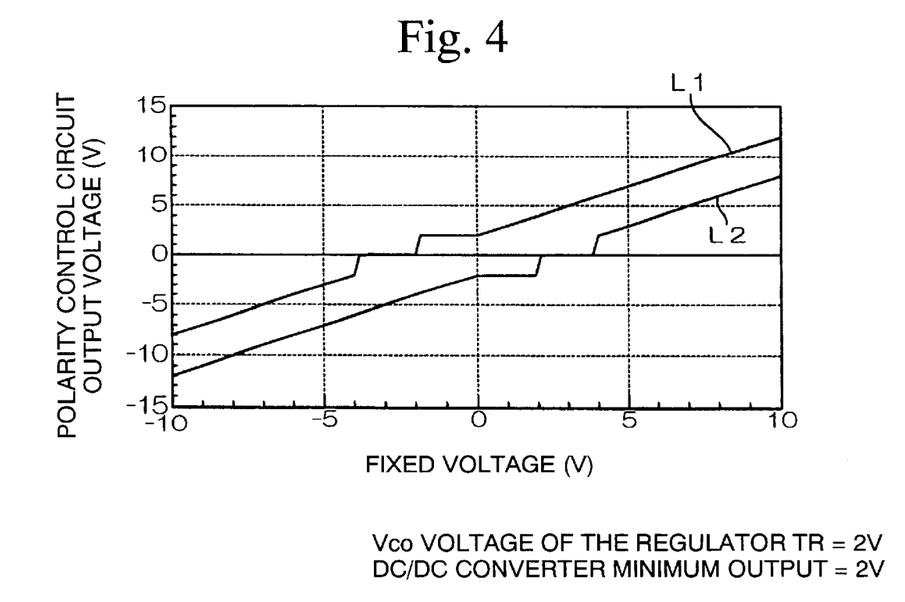
FIG. 4 is a conceptual diagram showing the output voltage of the polarity control circuits 23 and 24 with respect to the setting voltage in the case that the minimum output voltage of the switching power sources 21 and 22 is 2V.
Figure 5:
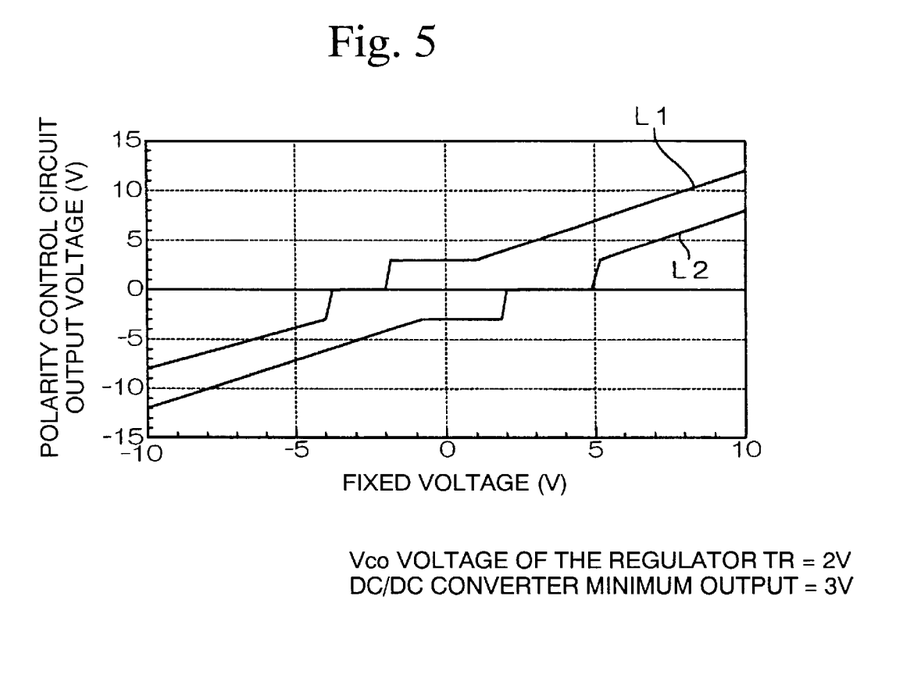
FIG. 5 is a conceptual diagram showing the output voltage of the polarity control circuits 23 and 24 with respect to the setting voltage in the case that the minimum output voltage of the switching power sources 21 and 22 is 3V.

In addition, FIG. 4 is a conceptual diagram showing the output voltage of the polarity control circuits 23 and 24 for the setting voltage in the case that the minimum output voltage of the switching power sources 21 and 22 is 2V. FIG. 5 is a conceptual diagram showing the output voltage of the polarity control circuits 23 and 24 for the setting voltage in the case that the minimum output voltage of the switching power sources 21 and 22 is 3V. In either of these cases, the change point voltage of the output voltage is different, but the basic operation is the identical.

B: Second Embodiment
B-1: Structure of the Second Embodiment

Next, the second embodiment of the present invention will be explained in detail.

In the case that, for example, a plurality of power sources are supplied to the DUT that is the tested object, or in the case that a plurality of DUTs are simultaneously measured, a plurality of voltage sources are necessary. In such cases, a plurality of the control circuit 5 and the control elements 6 and 7 shown in FIG. 1 can be provided. However, several types of control signals from the control circuit 25 will also become necessary.

Figure 6:
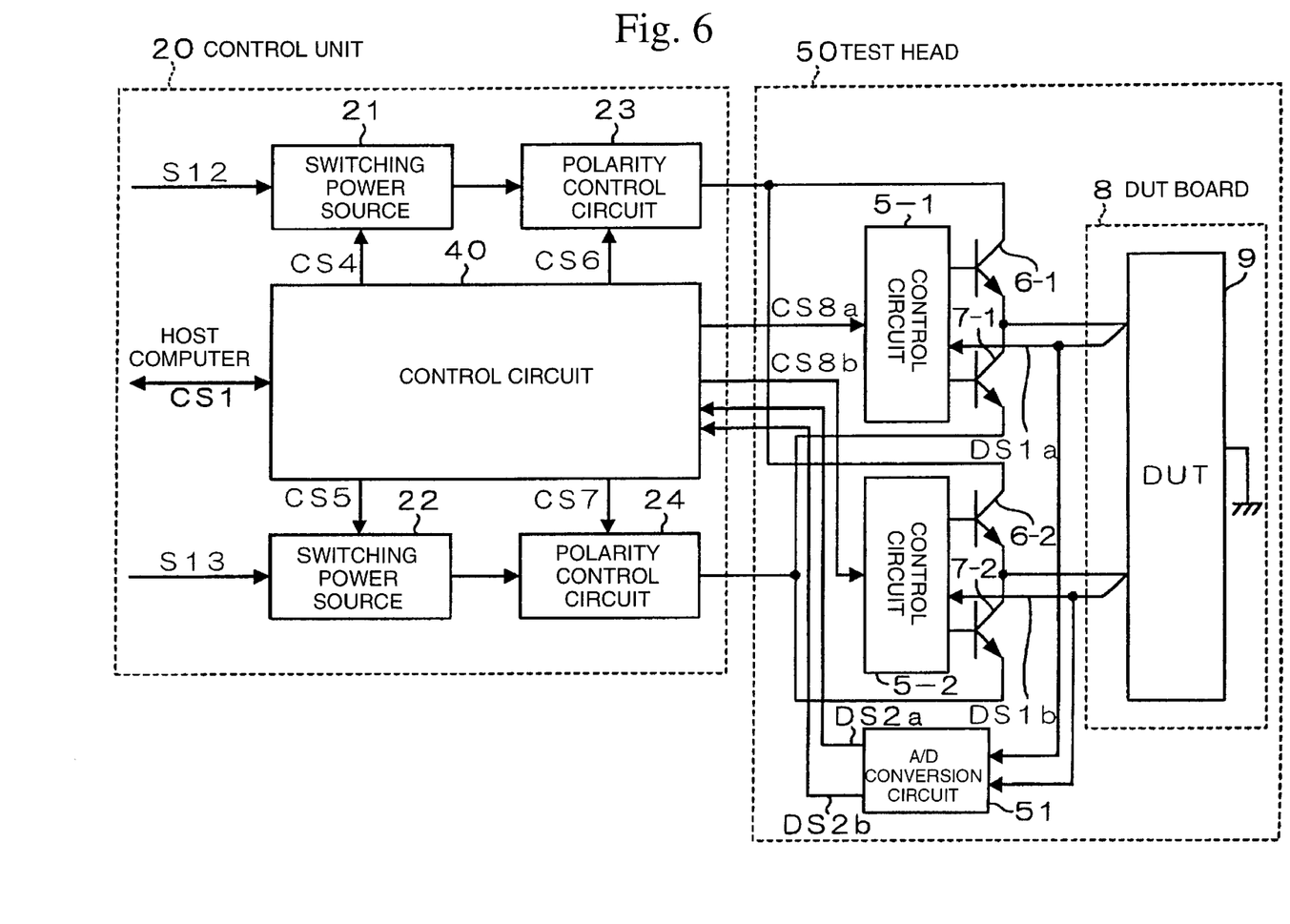
FIG. 6 is a block diagram showing the structure of the semiconductor test apparatus according to the second embodiment of the present invention.

FIG. 6 is a block diagram showing the structure of a semiconductor test apparatus according to the second embodiment of the present invention. Moreover, the parts corresponding to those in FIG. 1 are denoted by the same reference numerals and their explanations have been omitted. In the figure, the control circuit 40 supplies control signals CS 8a and CS 8b respectively to the control circuits 5-1 and 5-2 depending on control signal CS 1 from the host computer (not illustrated). The control circuit 40 can output two separate types of voltage setting values, that is, control signals CS 8a and CS 8b. However, the values of these voltage values must be close. In addition, the control circuit 40 outputs control signals CS 4 to CS 7 based on the detected signals DS 2a and DS 2b, that is, the first terminal voltage and the second terminal voltage of the DUT 9 that is the tested object, fed back via an A/D conversion circuit 51 from the test head 40, and thereby controls the switching power sources 21 and 22 and the polarity control circuits 23 and 24. Except for the plurality of control signal outputs and detected signal inputs, the control circuit 40 is identical to the control circuit 25 shown in FIG. 1.

The test head 50 provides control circuit 5-1 and control elements 6-1 and 7-1 as a first control system, control circuit 5-2 and control elements 6-2 and 7-2 as a second control system, and a DUT board on which the DUT 9 is mounted. The control circuit 5-1 calculates the difference between the control signal CS 8a, which is the first control target value, and the detected signal DS 1a, which is the first DUT terminal voltage of the DUT 9, and supplies the control signal produced by adding a bias for operating the control elements 6-1 and 7-1 to the differential signal. The control elements 6-1 and 7-1 control the DC voltage from the polarity identifying circuits 23 and 24 depending on the control signals from this control circuit 5-1, and apply a target setting voltage to the DUT 9 via the DUT board. Moreover, the control circuit 5-1 and the control elements 6-1 and 7-1 described above are structured identically to the control circuit 5 and the control elements 6 and 7 shown in FIG. 1.

In addition, the control circuit 5-2 calculates the difference between the control signal CS 8a, which is the second control target value, and the detected signal DS 1b, which is the second DUT terminal voltage of the DUT 9, and supplies to the control elements 6-2 and 7-2 the control signal produced by adding the bias for operating the control elements 6-2 and 7-2 to the differential signal. The control elements 6-2 and 7-2 control the DC voltage from the polarity identifying circuits 23 and 24 depending on the control signal from the control circuit 5-2 described above, and applies the target setting voltage to the DUT 9 via the DUT board 8. Moreover, the control circuit 5-2 and the control elements 6-2 and 7-2 described above are structured identically to the control circuit 5 and control elements 6 and 7 shown in FIG. 1.

The A/D conversion circuit 51 converts the detected signal DS 1a, which is the first DUT terminal voltage of the DUT 9, and the detection voltage DS 1b, which is the second DUT terminal voltage, to two digital signals, and supplies them to the control circuit 40 as detected signals DS 1a and DS 1b.

B-1: Operation of the Second Embodiment

Next, the operation of the second embodiment will be explained.

At the control circuit 40, the control signal CS 1, which indicates the setting voltage of the DUT and is supplied from the host computer, is supplied to the control circuit 5-1 of the test head 30 as the control signal CS 8a, and at the same time is supplied to the control circuit 5-2 of the test head 30 as the control signal 8b. In addition, at the control circuit 40, the control signals CS 4 to CS 7 are output based on the control signal CS 1, and thereby the switching power sources 21 and 22 and the polarity control circuits 23 and 24 are controlled.

At the switching power sources 21 and 22, each of the AC voltage power sources S 12 and S 13 are converted to DC voltages having a voltage value that is set by the control signals CS 4 and CS 5. The DC voltage from the switching power sources 21 and 22 are supplied to each of the polarity control circuits 23 and 24, and in the polarity control circuits 3 and 4, depending on signals CS 6 and CS 7, either the polarity is not reversed or is reversed and supplied to the control elements 6-1 and 7-1, or the voltage is shorted to the ground.

The control method by the control circuit 40 of the switching power sources 21 and 22 and the polarity control circuits 23 and 24 is identical to that of the first embodiment described above, and thus its explanation is omitted.

Next, at the control circuit 5-1, after the control signal CS 8a is converted to an analog control target value, the difference between the control target value and the detected signal DS 1a, which is the actual terminal voltage of the DUT 9 is calculated, the bias for operating the control elements 6-1 and 7-1 is added to the differential signal, and the result is supplied to the control elements 6-1 and 7-1.

At the control elements 6-1 and 7-1, the voltage to be output to the DUT 9 is generated from the output voltage from the polarity identification circuit 23 and 24 depending on the control signal (not illustrated) from the control circuit 5-1, and supplied to the DUT board 8. A voltage controlled by the control elements 6-1 and 7-1 is applied to the DUT 9 on the DUT board 8. In addition, the voltage of the DUT terminal of the DUT 9 is fed back to the control circuit 5-1 and the A/D conversion circuit 51 as the detected signal DS 1a. At the A/D conversion unit 51, the detected signal DS 1a (the first DUT terminal voltage) is converted to a digital value, and supplied to the host computer via the control circuit 40 as the detected signal DS 2a.

In contrast, at the control circuit 5-2, after the control signal CS 8b is converted to an analog control target value, the difference between the control target value and the detected signal DS 1b, which is the actual terminal voltage of the DUT 9, is calculated, a bias for operating the control elements 6-2 and 7-2 is added to the differential signal, and the result is supplied to the control elements 6-2 and 7-2.

At the control elements 6-2 and 7-2, the voltage to be input into the DUT 9 is generated from the output voltage from the polarity identification circuits 23 and 24 depending on the control signal (not illustrated) from the control circuit 5-2, and supplied to the DUT board 8. A voltage controlled by the control elements 6-2 and 7-2 is applied to the DUT 9 on the DUT board 8. In addition, the DUT terminal voltage of the DUT 9 is fed back to the control circuit 5-2 and the A/D conversion circuit 51 as detected signal DS 1b. At the A/D conversion circuit 51, the detected signal DS 1b (the second DUT terminal voltage) is converted to a digital signal and supplied to the host computer via the control circuit 40 as the detected signal DS 2b.

Moreover, in the example shown in FIG. 2 described above, the case was explained wherein two types of power source are supplied to the DUT 9 that is the tested object, but the case of three or more types can be structured in exactly the same manner.

C: Comparison Between the Present Invention and the Conventional Technology

Figure 7:
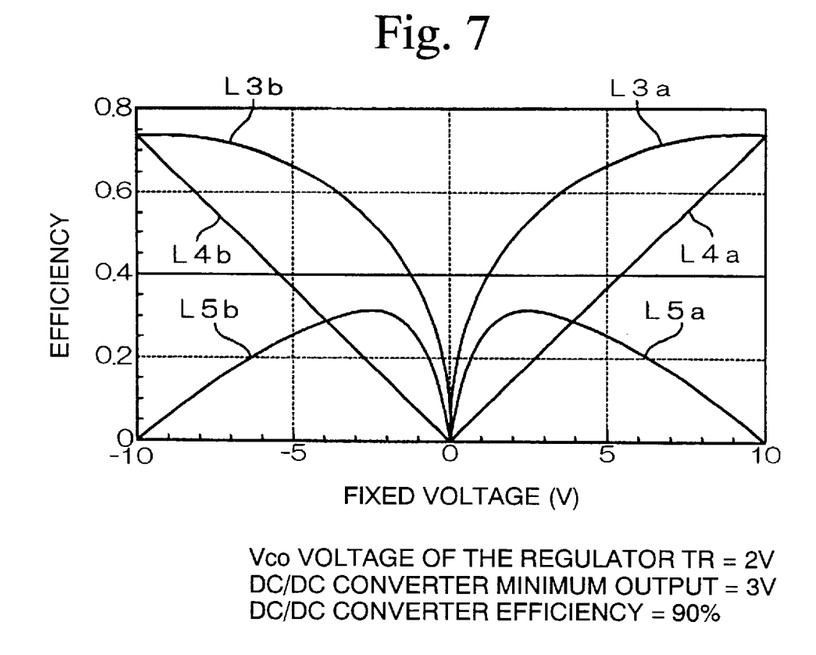
FIG. 7 is a conceptual diagram showing an example in which the efficiencies of the present invention and conventional technology are compared.

FIG. 7 is a conceptual diagram showing an example in which the efficiency of the present invention and the conventional technology is compared. In the figure, lines L 3a and L 3b represent the efficiency of the semiconductor test apparatus according to the present invention, lines L 4a and L 4b represent the efficiency of the semiconductor test apparatus according to the conventional technology, and lines L 5a and L 5b represent the amount of improvement. In the example illustrated, the case is assumed in which the efficiency of the switching power source is 90%, the voltage at which the control elements operate stably is 2V and the DUT setting voltage can be varied from −10V to +10V. Moreover, for the sake of simplicity of explanation, the consumption of power at the control circuits is ignored. In the 3V region widely used in recent semiconductor devices, it is clear that the efficiency has improved by approximately 30%.

Figure 8:
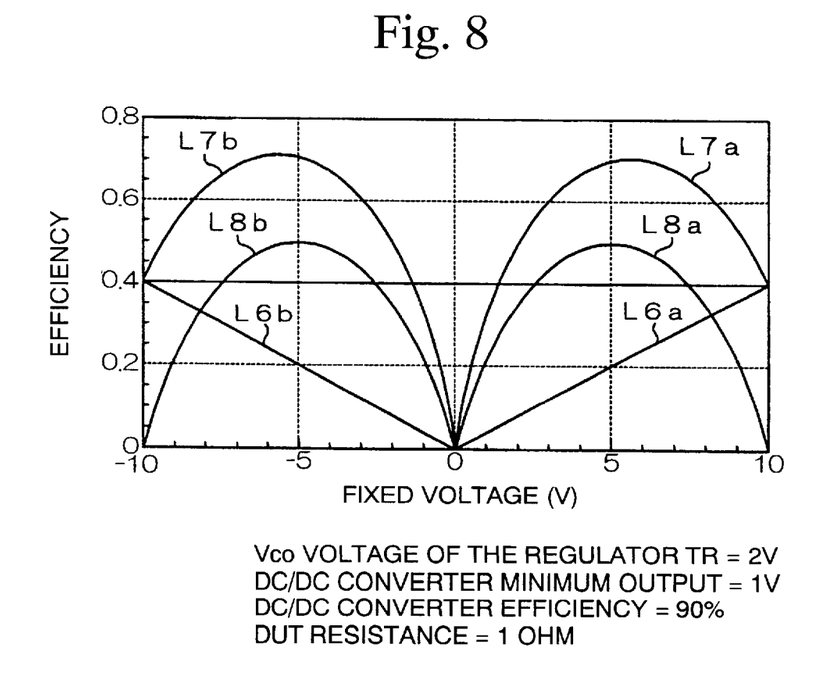
FIG. 8 is a conceptual diagram showing an example in which the amounts of heat generation of the present invention and conventional technology are compared.

Next, FIG. 8 is a conceptual diagram showing an example in which the amount of heat generation of the control elements 6 and 7 of the present invention and the conventional technology is compared. In the figure, lines L 6a and L 6b represent the amount of heat generation of the semiconductor test apparatus according to the present embodiment, lines L 7a and L 7b represent the amount of heat generation of the semiconductor test apparatus according to the conventional technology, and lines L 8a and L 8b represent the amount of improvement. The example in the figure is the case in which the setting of the minimum output voltage of the switching power sources is 2V, and all other parameters are identical to those in FIG. 7. From FIG. 8, with a DUT setting voltage in the 3V region, it is clear that the amount of heat generation is reduced by approximately 70% in comparison to the case of the conventional technology.

In the actual semiconductor test apparatus, not only the power source that is applied to the DUT 9, but carrying out transmission and reception of an extremely large number of types of signal sources is necessary, and dense mounting on the test head is required. If the mounting is dense, the amount of heat generation is high, and mounting becomes impossible due to thermal considerations. Thus, restraining the amount of the heat generation is necessarily required. According to the semiconductor test apparatus of the present invention, by increasing the efficiency, the amount of heat generation is reduced, and thus in the first embodiment, the control circuit 5, the control elements 6 and 7, and the A/D conversion circuit 31 can be easily mounted on the test head 30. In the second embodiment, the control circuit 5-1, the control elements 6-1 and 7-1, the control circuit 5-2, the control elements 6-2 and 7-2, and the A/D conversion circuit 31 can be easily mounted on the test head 30.

According to the embodiments above described, because the voltage drop in the control elements can be maintained substantially constant, the effect is obtained that even when the DUT setting voltage changes, the operational characteristics of the control elements can be maintained substantially constant.

In addition, because the control elements can be easily provided on the test head, the wiring between the control elements and the DUT becomes short, and thereby the effects are obtained that the loss due to the wiring material is small, the deterioration of the frequency characteristics is small, and the amount of noise cross-talk is reduced. Furthermore, the control signals between the control unit and the test head can all be transmitted as digital signals, and thus the effect is obtained that the distance is not restricted and there is no noise superimposition.

Furthermore, because the efficiency is improved, the amount of heat generation is reduced, the cooling apparatus can be simplified, and the power consumption is reduced, which makes a contribution to the reduction of global warning.

In addition, in the embodiments described above, the case was explained in which a constant voltage source is applied to the DUT, but using the same conception, a constant current source can easily be structured. In addition, the present invention can be applied not only semiconductor test apparatuses, but in all cases requiring a voltage source with an arbitrary voltage.

As has been explained above, according to the present invention, a plurality of variable voltages is generated by a constant voltage generating device, the polarity of the plurality of variable voltages is controlled by the voltage polarity control device, and the variable voltage applied to the measured device from the plurality of variable voltages having their polarity controlled are generated. Thus, by the first control device, the generation operation of the applied variable voltage in the control elements is controlled based on the fixed applied voltage to the measured device and the terminal voltage of the measured device fed back from the measured device. In addition, by the second control device, the variable voltage is controlled by the constant voltage generating device and the polarity control is controlled by the voltage polarity control device. Thus, the advantages are obtained that the power consumption is reduced, the frequency characteristics are improved, and the noise superimposition is reduced.

What is claimed is:

1. A semiconductor test apparatus that applies a variable voltage to a measured device to test the measured device, comprising:

a constant voltage generating device for generating a plurality of variable voltages;

a plurality of voltage polarity control devices each for controlling the polarity of a respective one of said plurality of variable voltages generated by said constant voltage generating device;

a plurality of control elements each for applying a variable voltage whose polarity is controlled by the respective voltage polarity control device to said measured device;

a first control device that controls the application operation of the applied variable voltage by each of said control elements based on a fixed applied voltage that is applied to said measured device and a terminal voltage of said measured device fed back from said measured device; and a second control device that controls the value of each of the variable voltages generated by said constant voltage generating devices and the polarity control controlled by each of said plurality of voltage polarity control devices based on the voltages applied to said measured device by said plurality of control elements and the terminal voltage of said measured device fed back from said measured device.

2. A semiconductor test apparatus according to claim 1 wherein said second control device links a voltage drop amount of each of said control elements to the fixed applied voltage that is applied to said measured device so that the value thereof becomes sufficient for the operation of said plurality of control elements, and controls the value of each of the variable voltages value generated by said constant voltage generating device and the polarity control controlled by each of said plurality of voltage polarity control devices.

3. A semiconductor test apparatus according to claim 1 wherein:
   said plurality of control elements and said first control device are provided on a test head on which said measured device is mounted;
   said constant voltage generating device, said plurality of voltage polarity control devices, and said second control device are provided on a control unit disposed separated from said test head; and
   a digital signal is used in signal propagation between said test head and a control unit.

4. A semiconductor test apparatus according to claim 1 wherein said constant voltage generating devices comprise:
   a first switching constant voltage generating device that generates an output voltage that is larger than the fixed voltage that is applied to said measured device; and
   a second switching constant voltage generating device that generates an output voltage that is smaller than the fixed voltage that is applied to said measured device.

5. A semiconductor test apparatus according to claim 1 wherein each said voltage polarity control device can reverse or not reverse the polarity of the respective variable voltage generated by said constant voltage generating device that it controls or short circuit the said respective variable voltage based on the control of said second control device.

6. A semiconductor test apparatus according to claim 4 wherein said second control device:
   A: in the case that the fixed applied voltage that is applied to said measured device is positive,
      the voltage output of said first switching constant voltage generating device is output as is in the case that the output voltage of the first switching constant voltage generating device can be set to a voltage level equivalent to said fixed applied voltage having added thereto the amount of voltage drop necessary for allowing the control elements supplied with voltage by said first switching device to operate stably;
      the minimum output voltage of said first switching constant voltage generating device is output in the case that a voltage of a level equivalent to said fixed applied voltage having added thereto the amount of voltage drop necessary for allowing the control element supplied with voltage by said first switching device to operate stably is lower than the minimum output voltage of said first switching constant voltage generating device;
      the output voltage of said second switching voltage generating device is output as is in the case that the output voltage of said second switching constant voltage generating device can be set to a voltage of a level equivalent to said fixed applied voltage having subtracted therefrom the amount of voltage drop necessary for allowing the control element supplied with voltage by said first switching device to operate stably;
      the output of said second switching constant voltage generating device is shorted the associated voltage polarity control device in the case that a voltage of a level equivalent to said fixed applied voltage having subtracted therefrom the amount of voltage drop necessary for allowing the control element supplied with voltage by said second switching device to operate stably is positive, and this voltage is smaller than the minimum output voltage of said second switching constant voltage generating device;
      the minimum output voltage of said second switching constant voltage generating device is output and the output of said voltage polarity control device located at the output side of said second switching constant voltage generating device is reversed in the case that a voltage of a level equivalent to said fixed applied voltage having subtracted therefrom the amount of voltage drop necessary for allowing the control element supplied with voltage by said second switching device to operate stably is negative, and this voltage is smaller than the minimum output voltage of said second switching constant voltage generating device;
      the values of the variable voltages controlled by said constant voltage generating device and the polarity control the respective controlled by each said voltage polarity control device are controlled such that the absolute value of the output voltage from said second switching constant voltage generating device is output and the output of said voltage polarity control device that is located at the output side of said second switching constant voltage generating device is reversed in the case that a voltage of a level equivalent to said fixed applied voltage having subtracted therefrom the amount of voltage drop necessary for allowing the control element supplied with voltage by said second switching device to operate stably is negative and larger than the minimum output voltage of said second switching voltage generating device; and
   B: in the case that a target voltage applied to said measured device is negative:
      the output voltage of the second switching constant voltage generating device is output and the output of said voltage polarity control device, which is located at the output side of said second switching constant voltage generating device, is reversed in the case that the output voltage of said second switching constant voltage generating device can be set to the absolute value of a voltage of a level equivalent to said fixed applied voltage having subtracted therefrom the amount of voltage drop necessary for allowing the control element supplied with voltage by said second switching device to operate stably is lower than the minimum output voltage of said second switching constant voltage generating device;
      the output voltage of said first switching constant voltage generating device is output and the output of the associated voltage polarity control device, which is located at the output side of said second switching constant voltage generating device, is reversed in the case that the output voltage of said first switching constant voltage generating device can be set to the absolute value of a voltage of a level equivalent to said fixed applied voltage having added thereto the amount of voltage drop necessary for allowing the control element supplied with voltage by said first switching device to operate stably;
      the output of said voltage polarity control device, located at the output side of said first switching constant voltage generating device, is shorted in the case that a voltage of a level equivalent to said fixed applied voltage having added thereto the amount of voltage drop necessary for allowing the control element supplied with voltage by said first switching device to operate stably is negative and smaller than the value produced by multiplying the minimum output voltage of said switching constant voltage generating device by −1;

the minimum output voltage of said first switching constant voltage generating device is output in the case that a voltage of a level equivalent to said fixed applied voltage having added thereto the amount of voltage drop necessary for allowing the control element supplied with voltage by said first switching device to operate stably is positive and smaller than the minimum output voltage of said first switching constant voltage generating device; and the variable voltage values controlled by said constant voltage generating device and the polarity control controlled by said voltage polarity control devices are controlled such that the output voltage of said first switching constant voltage generating device is output as is in the case that a voltage equivalent to said fixed applied voltage having added thereto the amount of voltage drop necessary for allowing the control element supplied with voltage by said first switching device to operate stably is positive and larger than the minimum output voltage of said first switching constant voltage generating device.

7. A semiconductor test apparatus according to claim 1 wherein said control elements and said first control device form one group, and further comprising a plurality of said groups provided in parallel, and the plurality of applied variable voltages generated by each of said groups is applied to said measured device.

* * * * *